United States Patent [19]

Willems

[11] Patent Number: 4,714,904
[45] Date of Patent: Dec. 22, 1987

[54] MAGNETOSTATIC WAVE DEVICE UNIT

[75] Inventor: David A. Willems, Hoagland, Ind.

[73] Assignee: ITT Aerospace Optical, Fort Wayne, Ind.

[21] Appl. No.: 927,774

[22] Filed: Nov. 5, 1986

[51] Int. Cl.⁴ .............................................. H03H 9/10
[52] U.S. Cl. .................................. 333/148; 333/187; 310/349
[58] Field of Search ............... 333/141, 148, 149, 187, 333/192, 158; 310/348, 349, 352, 368

[56] References Cited

U.S. PATENT DOCUMENTS 3,340,484  9/1967  Siekanowicz et al. ............. 333/158
3,793,598  2/1974  Hofelt et al. ..................... 333/148 X Primary Examiner—Eugene R. LaRoche
Assistant Examiner—Seung Ham
Attorney, Agent, or Firm—Robert A. Walsh; Mary C. Werner

[57] ABSTRACT

A magnetostatic wave device unit in which the magnetic biasing unit includes a carrier member which contains one of the pole pieces and forms an enlarged mechanical and electrical support surface for a magnetostatic wave device.

15 Claims, 3 Drawing Figures

MAGNETOSTATIC WAVE DEVICE UNIT

TECHNICAL FIELD

The present invention relates, in general, to magnetostatic wave propagation of microwave signals and, in particular, to a magnetic biasing unit for magnetostatic wave devices.

BACKGROUND ART

In a magnetostatic wave device, microwave frequency signals are propagated in a magnetically biased ferrite film. The frequency of operation of a magnetostatic wave device is related to the amplitude of the magnetic bias field. The higher the amplitude of the magnetic bias field, the higher the frequency of operation. Either permanent magnets or electromagnets can be used to supply the magnetic bias. Use of a permanent magnet for the magnetic bias has the advantage that electrical power is not required.

Typically, the permanent magnets, formed from a permanent magnet material, such as Samarium cobalt or Neodyminum iron boron, are mounted on a soft iron yoke which serves as a magnetic flux return path. Soft iron pole pieces, attached to the magnets, provide a uniform magnetic field in the gap between the magnets. The magnetostatic wave device is placed in the magnetic field between the two pole pieces.

As the frequency of the signals propagated by the magnetostatic wave device increases, the amplitude of the magnetic bias field must be increased. As the magnetic bias field is increased, the faces of the pole pieces must be reduced to concentrate the magnetic flux into a smaller area, thereby increasing the magnetic field in the gap between the magnets.

The size of the overall magnet structure is a function of the length of the gap between the magnets. By minimizing the gap length, the size of the magnet structure can be reduced. To minimize the length of the gap between the magnets, one of the pole pieces serves as a physical support for the magnetostatic wave device. However, when the surface area of the pole piece is reduced as the magnetic bias is increased, there may remain inadequate surface area to provide support for the magnetostatic wave device. If the pole piece which supports the magnetostatic wave device is widened to provide the necessary surface area to support the magnetostatic wave device, the required high magnetic field in the gap between the magnets cannot be maintained.

DISCLOSURE OF THE INVENTION

Accordingly, a magnetostatic wave device unit, constructed in accordance with the present invention, includes a magnetic biasing unit which has a soft iron yoke and first and second magnets secured opposite one another on the yoke to form a gap between the magnets. First and second pole pieces are secured to the first and second magnets, respectively, with each of the pole pieces having a base surface positioned against its respective magnet and a top surface facing the top surface of the other pole piece. The top surfaces of the pole pieces are smaller than the base surfaces of the pole pieces to concentrate the magnetic flux produced by the magnets in the top surfaces of the pole pieces. The magnetic biasing unit also includes a nonmagnetic metallic carrier member which has an opening through which one of the pole pieces extends. This pole piece and the carrier member jointly support a magnetostatic wave device positioned between the pole pieces and which could not be supported by the pole piece alone. Input signals to the magnetostatic wave device and output signals from the magnetostatic wave device are coupled through means which are mounted on the carrier member.

BRIEF DESCRIPTION OF THE DRAWING

Referring to the drawing.

BEST MODE FOR CARRYING OUT THE INVENTION

Figure 1:
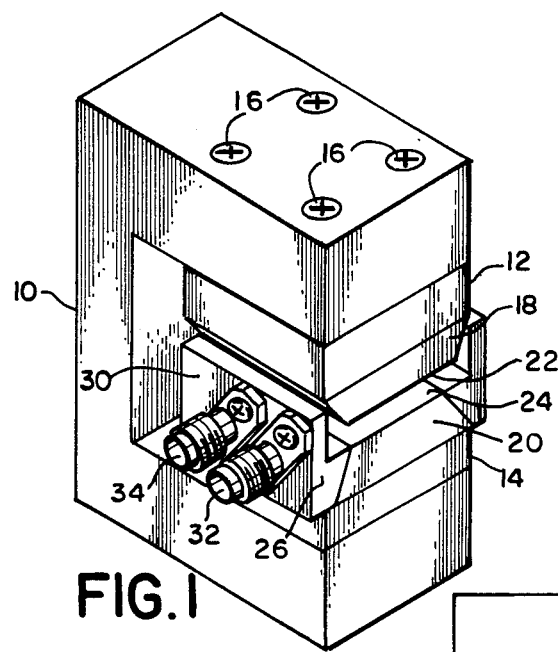
FIG. 1 is a perspective view of a magnetostatic wave device magnetic biasing unit constructed in accordance with the present invention.

Referring to FIG. 1, a magnetostatic wave device magnetic biasing unit, constructed in accordance with the present invention, includes a soft iron yoke 10 and first and second magnets 12 and 14 secured opposite one another on yoke 10 to form a gap between the magnets. Magnets 12 and 14 are illustrated as permanent magnets, although electromagnets also may be used. Magnets 12 and 14 are secured to yoke 10 by suitable fastening means, such as screws 16.

The magnetic biasing unit of FIG. 1 also includes first and second pole pieces 18 and 20 positioned against and secured to magnets 12 and 14, respectively. Pole pieces 18 and 20 are aligned vertically and tapered toward each other to form opposed faces 22 and 24 which are spaced and within which magnetic flux produced by magnets 12 and 14 is concentrated. In particular, each of the pole pieces has a base surface which is positioned against its respective magnet and a top surface facing the top surface of the other pole piece and which is smaller than the base surface of its pole piece.

Figure 2:
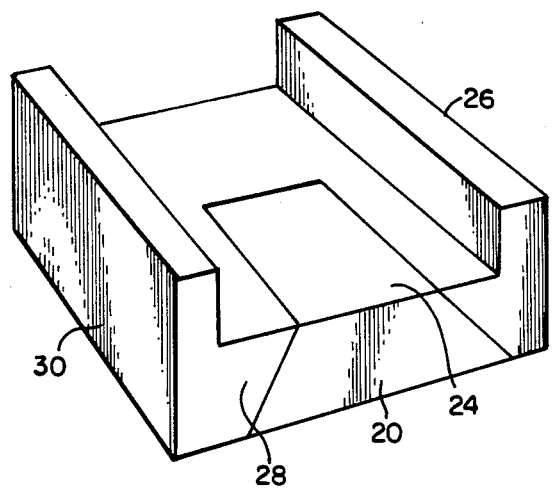
FIG. 2 is a perspective view of the magnetostatic wave device support assembly portion of the FIG. 1 unit.

The magnetic biasing unit of FIG. 1 further includes a nonmagnetic metallic carrier member 26 which has a tapered opening within which pole piece 20 is fitted. Carrier member 26 and pole piece 20 form a support assembly, shown in FIG. 2, which has an enlarged area and is adapted to support a magnetostatic wave device which might otherwise be too large to be supported by pole piece 20 alone. Carrier 26 also supports means for coupling input signals to a magnetostatic wave device supported by carrier member 26 and pole piece 20 and output signals from this magnetostatic wave device.

Specifically, carrier 26 has a base 28 and a side wall 30. Base 28 contains the tapered opening through which pole piece 20 extends. The upper surface of base 28, containing the smaller end of the tapered opening, and top surface 24 of pole piece 20 lie in a common plane, thereby providing a flat support surface for a magnetostatic wave device. The tapered opening in base 28 matches the taper of pole piece 20, so that the pole piece is fitted within the tapered opening to produce a good electrical contact between the carrier member and the pole piece. The importance of this point will be explained below. For the embodiment of the invention illustrated, the tapered opening in base 28 of carrier number 26 is rectangular in horizontal cross-section and extends along the length of the carrier member from an edge of the carrier member. Carrier member 26 is fabricated from a nonmagnetic material, such as brass.

As shown in FIG. 1, side wall 30 of carrier member 26 supports a pair of coaxial connectors 32 and 34. Depending upon the particular application, one of the coaxial connectors serves to couple an input signal from a signal source to a magnetostatic wave device supported by carrier member 26 and pole piece 20 and the other coaxial connector serves to couple an output signal from this magnetostatic wave device to a utilization unit.

Figure 3:
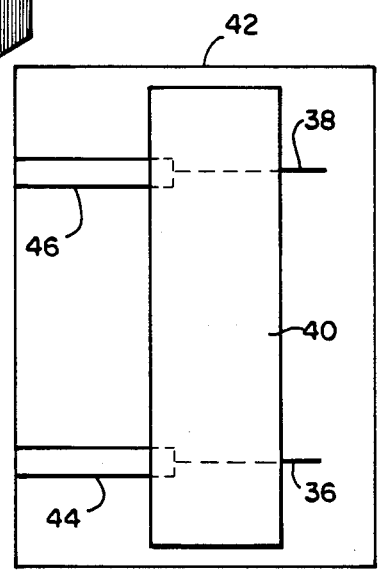
FIG. 3 is a schematic representation of a magnetostatic wave device with which the magnetic biasing unit of FIG. 1 may be used.

FIG. 3 illustrates schematically a magnetostatic wave device which may be used with the magnetic biasing unit shown in FIG. 1. This magnetostatic wave device includes a pair of transducers 36 and 38 and a ferrite film 40 applied to a dielectric substrate 42. Ferrite film 40 may be formed from yttrium iron garnet.

Transducers 36 and 38 are either open circuited or short-circuited microstrip lines. The criteria for choosing between the two are well known to those skilled in the art.

Microwave energy is transmitted to and from transducers 36 and 38 by means of a pair of microstrip feed lines 44 and 46. The microstrip feed lines are connected to coaxial connectors 32 and 34, respectively. The microstrip feed lines and transducers require a ground plane for proper operation.

As indicated previously, pole piece 20 and carrier member 26 preferably are fitted together in such a way as to establish good electrical contact between the two. This permits using the support assembly, composed of pole piece 20 and carrier member 26, as a ground plane under substrate 42, microstrip lines 44 and 46, and transducers 36 and 38 of the magnetostatic wave device and as a ground termination for the shield of coaxial connectors 32 and 34.

When a magnetostatic wave device, such as the one illustrated schematically in FIG. 3, is positioned between pole pieces 18 and 20, pole piece 20, in the absence of carrier member 26, may be too small to support the magnetostatic wave device. For example, the magnetostatic wave device, being magnetostatic forward volume wave device, whereby the magnetostatic wave device is positioned with the surface of ferrite film 40 perpendicular to the direction of the magnetic bias field, the area of top surface 24 of pole piece 20 can be smaller than the area of the magnetostatic wave device.

While in the foregoing there has been described a preferred embodiment of the present invention, it should be understood to those skilled in the art that various modifications and changes can be made without departing from the true spirit and scope of the invention as recited in the claims.

I claim:

1. A magnetostatic wave device magnetic biasing unit comprising:
   a soft iron yoke;
   first and second magnets secured opposite one another on said yoke to form a gap between said magnets;
   first and second pole pieces secured to said first and second magnets, respectively, and tapered toward each other to form first and second opposed faces, respectively, within which magnetic flux produced by said magnets is concentrated;
   a nonmagnetic metallic carrier member having a tapered opening within which said second tapered pole piece is fitted in electrical contact with said carrier member, said second opposed face of said second pole piece and the surface of said carrier member at the smaller end of said tapered opening lying in a common plane and forming a support surface adapted to support a magnetostatic wave device;
   and means mounted on said carrier member for coupling an input signal from a signal source to a magnetostatic wave device supported by said second pole piece and said carrier member and for coupling an output signal from a magnetostatic wave device supported by said second pole piece and said carrier member to a utilization unit.

2. A magnetostatic wave device magnetic biasing unit according to claim 1 wherein said carrier member includes:
   (a) a base through which said tapered opening extends, and
   (b) a side wall on which said coupling means are mounted.

3. A magnetostatic wave device magnetic biasing unit according to claim 2 wherein said tapered opening in said carrier member has a taper which matches the taper of said second tapered pole piece.

4. A magnetostatic wave device magnetic biasing unit according to claim 3 wherein said opening has a rectangular cross-section which extends along the length of said carrier member from an edge thereof.

5. A magnetostatic wave device magnetic biasing unit according to claim 4 wherein the area of said second opposed face of said second pole piece is smaller than the area of a magnetostatic wave device supported by said second pole piece and said carrier member.

6. A magnetostatic wave device magnetic biasing unit according to claim 1 wherein said carrier member is formed from brass.

7. A magnetostatic wave device magnetic biasing unit comprising:
   a soft iron yoke;
   first and second magnets secured opposite one another on said yoke to form a gap between said magnets;
   a first tapered pole piece having a base surface positioned against said first magnet;
   a support assembly including a nonmagnetic metallic carrier member and a second tapered pole piece fitted within said carrier member in electrical contact with said carrier member, said second tapered pole piece having a base surface positioned against said second magnet and a top surface facing the top surface of said first tapered pole piece and spaced from said top surface of said first tapered pole piece;
   and means mounted on said carrier member for coupling an input signal from a signal source to a magnetostatic wave device supported by said second pole piece and said carrier member and for coupling an output signal from a magnetostatic wave device supported by said second pole piece and said carrier member to a utilization unit.

8. A magnetostatic wave device magnetic biasing unit according to claim 7 wherein said carrier member includes:
   (a) a base within which said second tapered pole piece is fitted, and
   (b) a side wall on which said coupling means are mounted.

9. A magnetostatic wave device magnetic biasing unit according to claim 8 wherein said carrier member has a tapered opening extending through said base which has a taper which matches the taper of said second tapered pole piece.

10. A magnetostatic wave device unit comprising;
a soft iron yoke;
first and second magnets secured opposite one another on said yoke to form a gap between said magnets;
first and second aligned pole pieces secured to said first and second magnets, respectively, each of said pole pieces having a base surface positioned against its respective magnet and a top surface facing the top surface of the other pole piece which is smaller than the base surface of its pole piece;
a nonmagnetic metallic carrier member having an opening through which said second pole piece extends and having a support surface lying in a plane containing the top surface of said second pole piece;
a magnetostatic wave device positioned between the top surfaces of said pole pieces and supported on said support surface of said carrier member and said top surface of said second pole piece;
first signal coupling means mounted on said carrier member for coupling an input signal to said magnetostatic wave device;
and second signal coupling means mounted on said carrier member for coupling an output signal from said magnetostatic wave device.

11. A magnetostatic wave device unit according to claim 10 wherein the shape of said second pole piece matches said opening in said carrier member and said carrier member and said second pole piece are fitted together in electrical contact.

12. A magnetostatic wave device unit according to claim 11 wherein said carrier member includes:
(a) a base through which said opening extends, and
(b) a side wall on which said first and second signal coupling means are mounted.

13. A magnetostatic wave device unit according to claim 12 wherein said pole pieces are tapered.

14. A magnetostatic wave device unit according to claim 13 wherein said magnetostatic wave device is a magnetostatic forward volume wave device.

15. A magnetostatic wave device unit according to claim 14 wherein said carrier member is formed from brass.

* * * * *